United States Patent [19]

Nocek

[11] 4,141,457
[45] Feb. 27, 1979

[54] TRANSFER ARM ASSEMBLY FOR PLATE MAKING SYSTEM
[75] Inventor: Stanley J. Nocek, Clifton, N.J.
[73] Assignee: Sun Chemical Corporation, New York, N.Y.
[21] Appl. No.: 802,981
[22] Filed: Jun. 2, 1977
[51] Int. Cl.² .................... B66C 1/02; B65G 47/24
[52] U.S. Cl. ............................ 214/1 BV; 198/403; 214/1 Q; 214/91 R; 214/147 T
[58] Field of Search ............... 214/1 BV, 1 Q, 147 T, 214/147 G, 1 BD, 91 R; 198/402, 403, 485

[56] References Cited
U.S. PATENT DOCUMENTS 3,753,509 8/1973 Kock .............................. 198/485 X
3,896,926 7/1975 Cuniberti ........................... 198/402

Primary Examiner—Francis S. Husar
Assistant Examiner—George F. Abraham
Attorney, Agent, or Firm—Cynthia Berlow

[57] ABSTRACT

A transfer arm assembly for transferring an exposed lithographic plate from a film negative drawer to a delivery belt system for delivering the plate to a photoprocessor which develops the plate is provided. The transfer arm assembly includes vacuum arms which contact the upper and non-emulsion side of the plate when the plate lies flat on the film negative drawer (or vacuum frame) and deliver the plate in an inverted position on top of the belts in a plane parallel to, but above the plane of the plate on the film negative drawer. A latchable arm is provided in the transfer arm system to enable pivoting of the arm about a first axis for a first portion of its rotation, and then about a second axis for a second portion of its rotation to enable the arms and plate carried thereby to be inverted from a first plane to a second parallel, but spaced plane.

10 Claims, 22 Drawing Figures

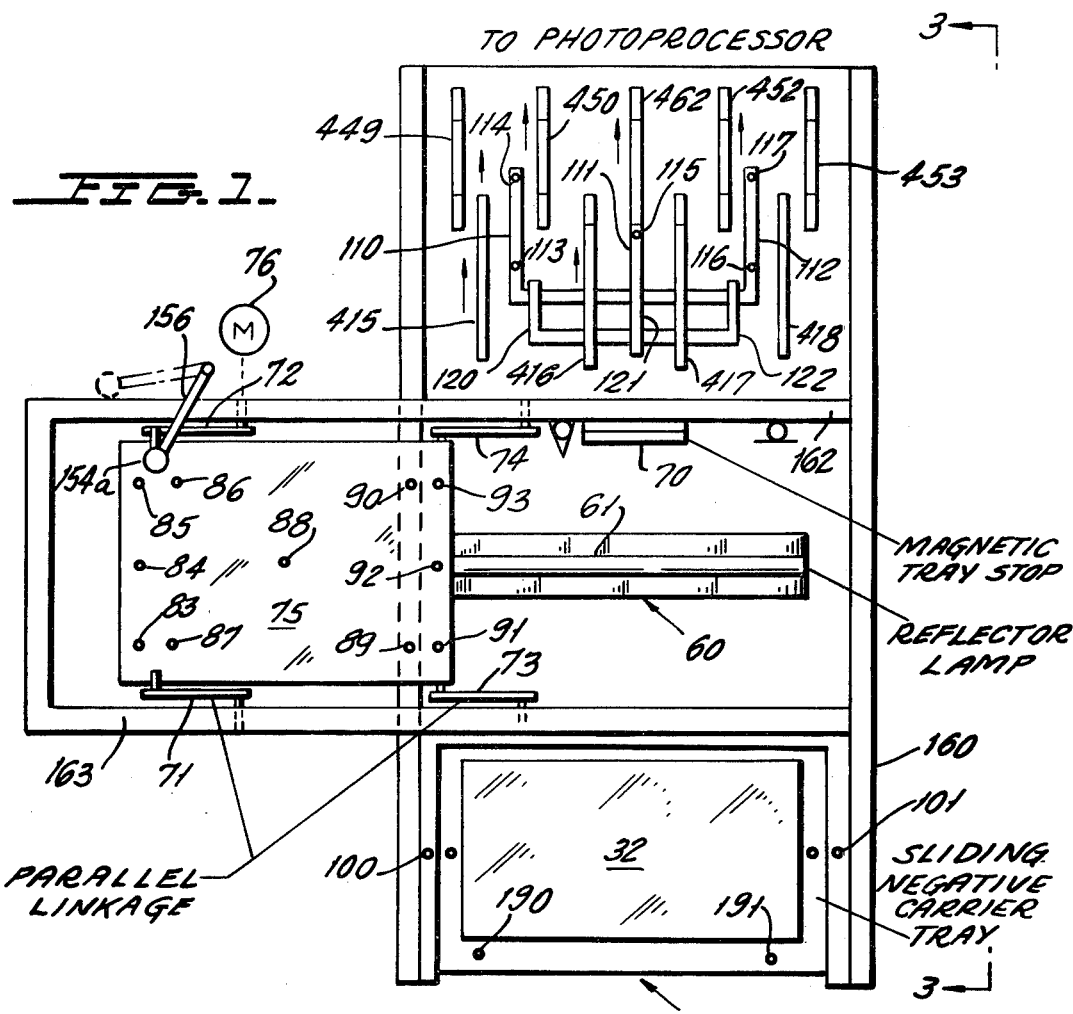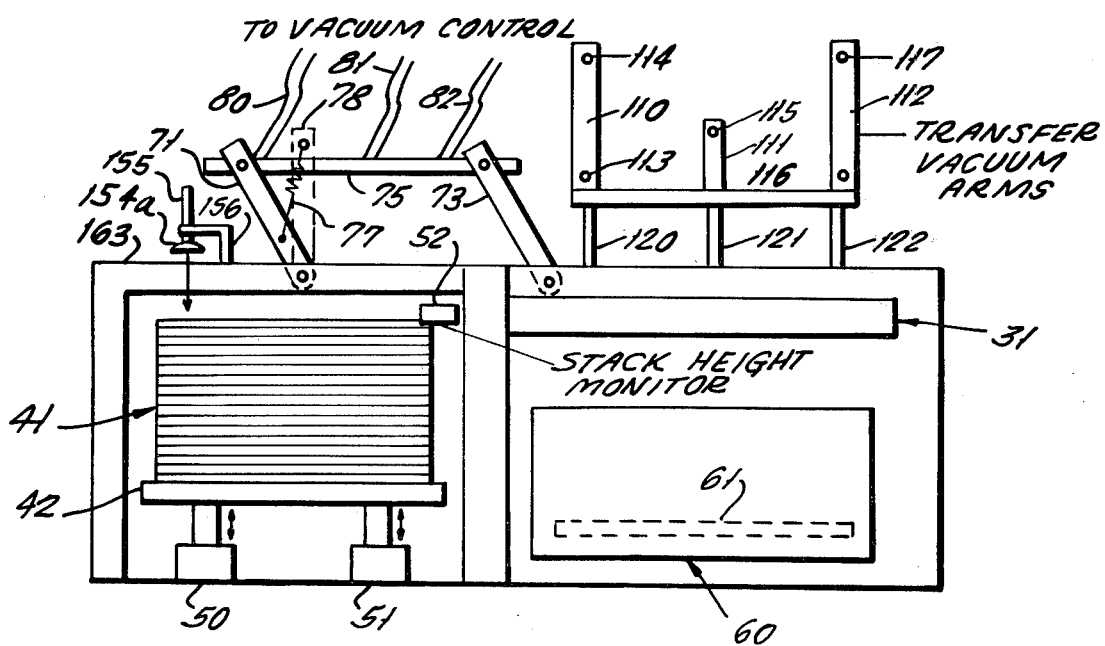

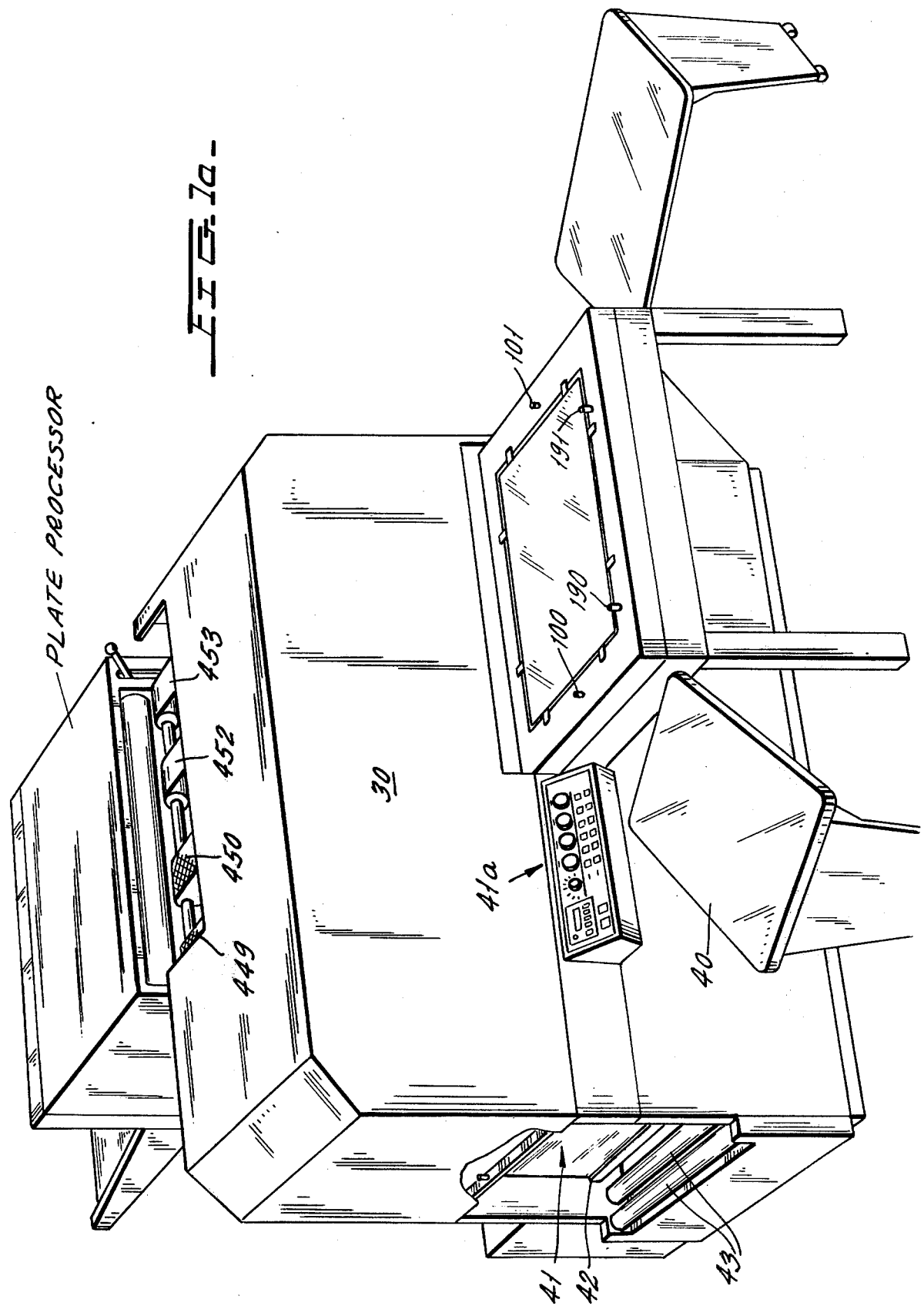

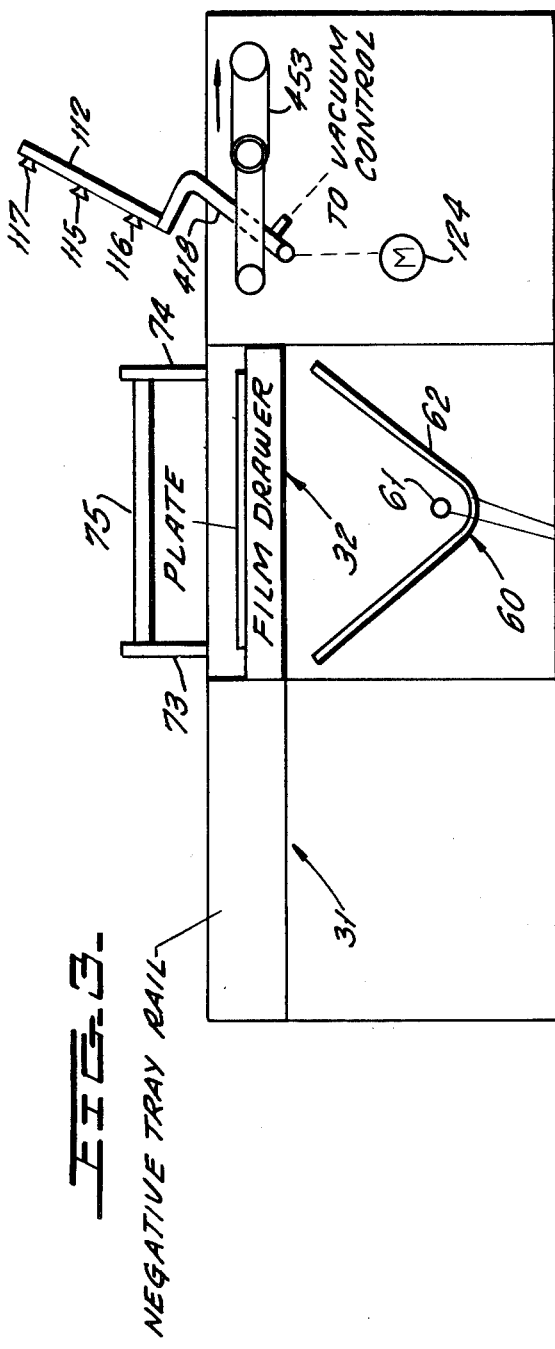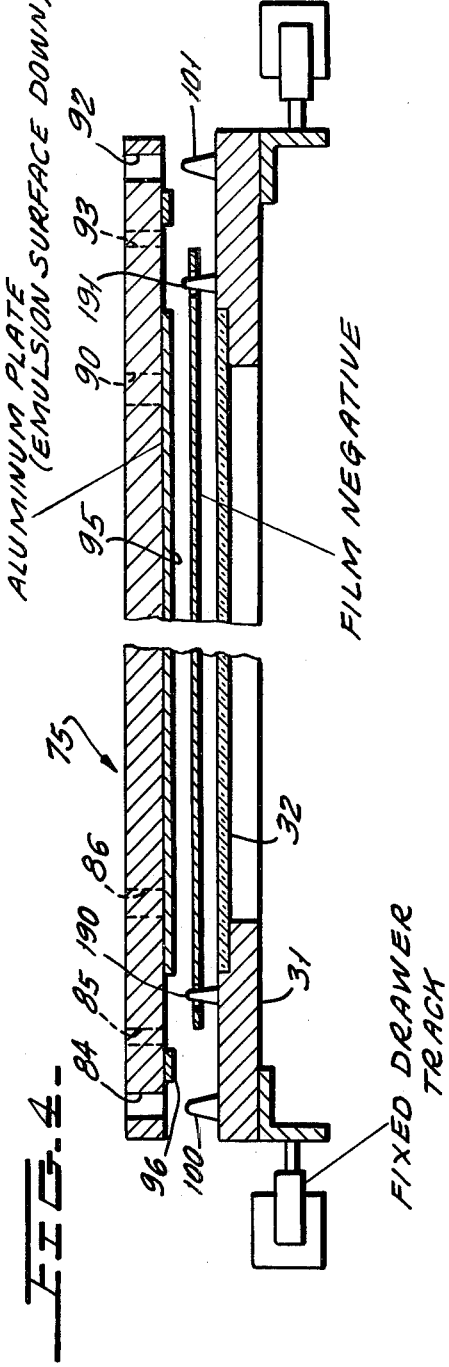

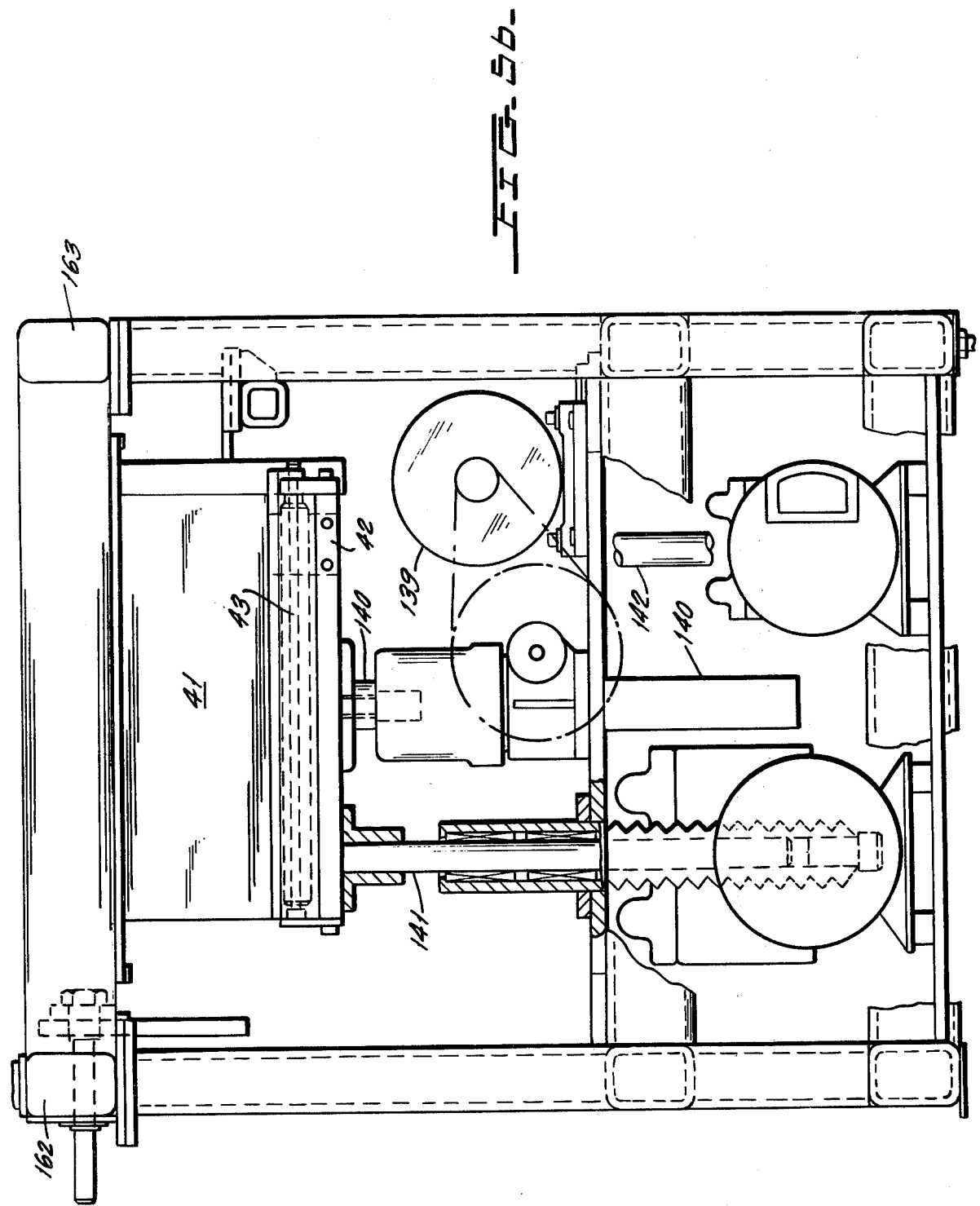

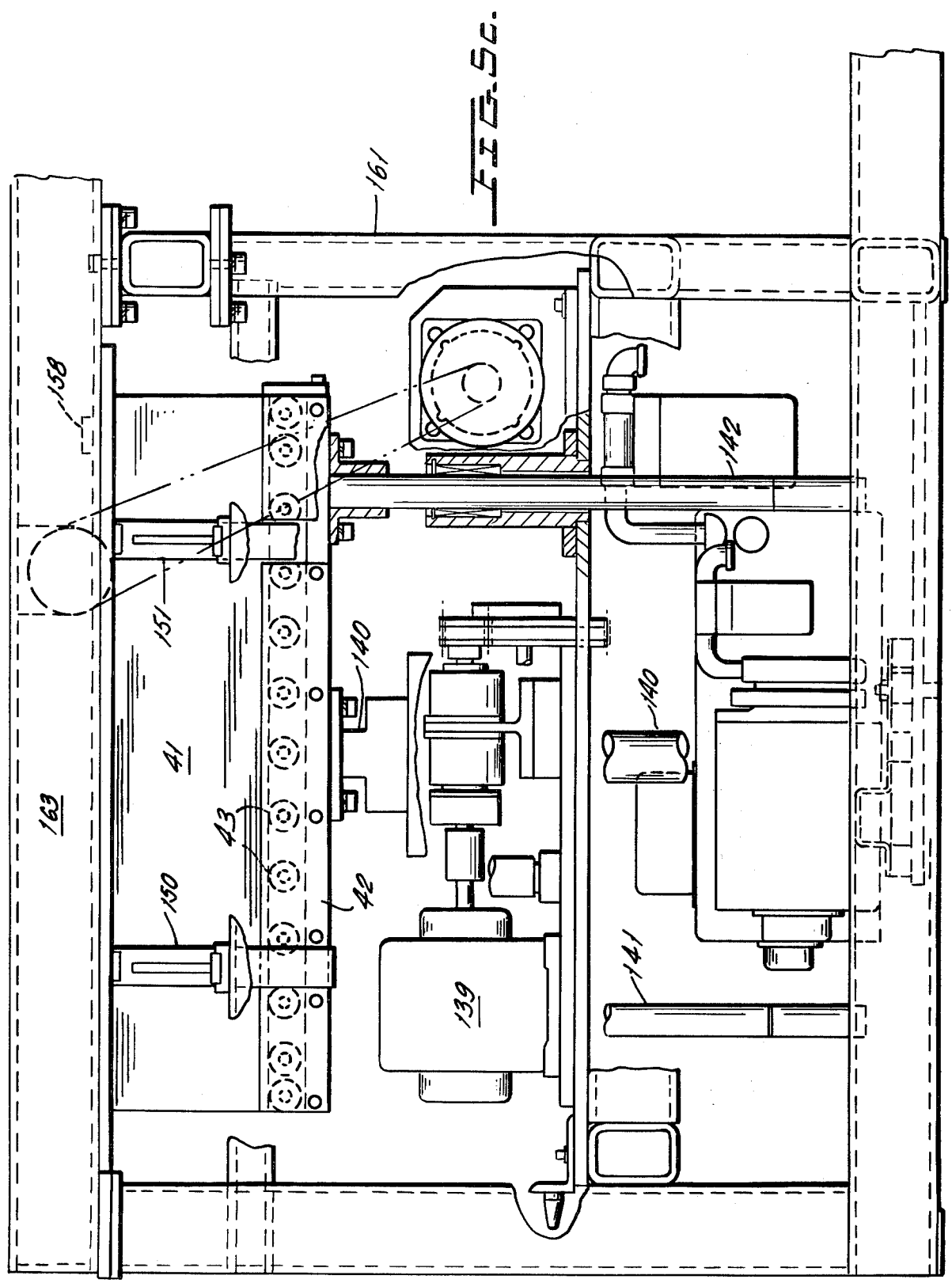

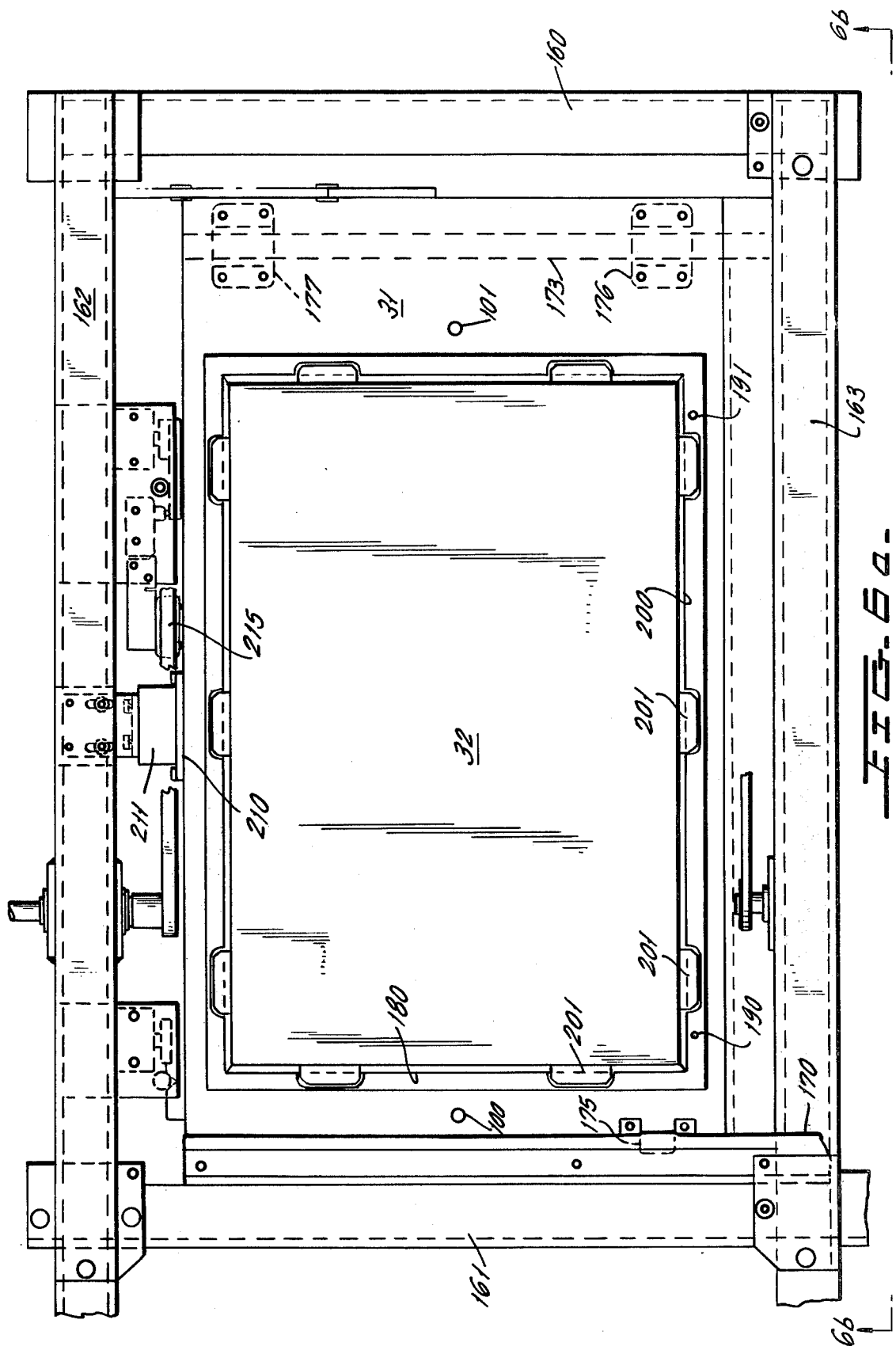

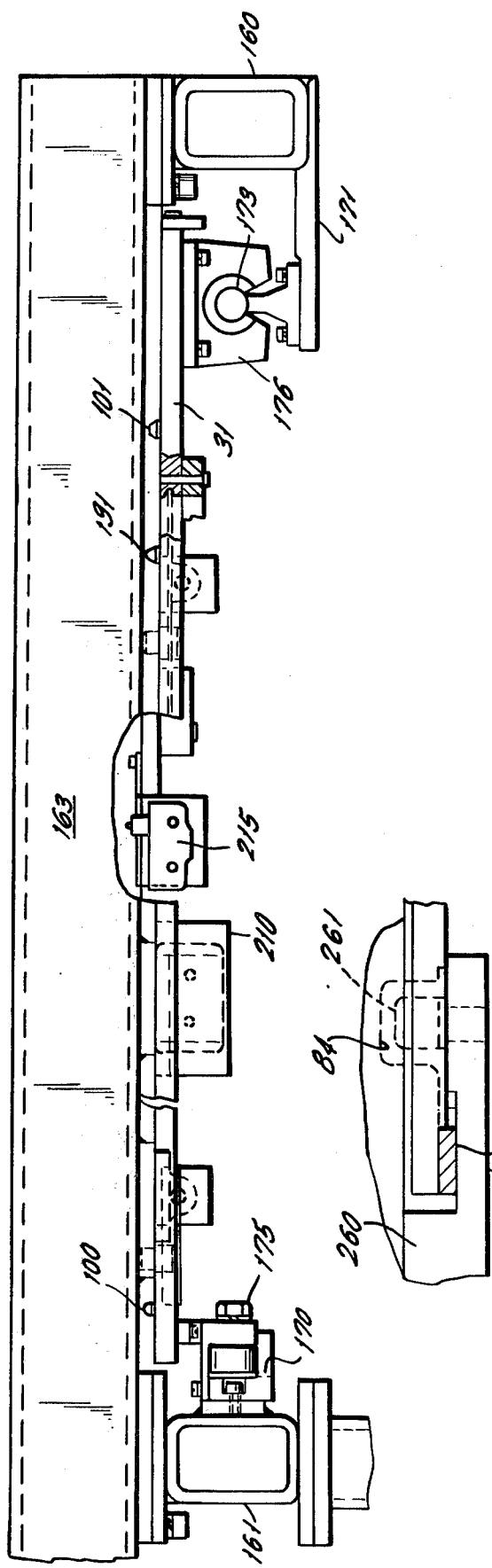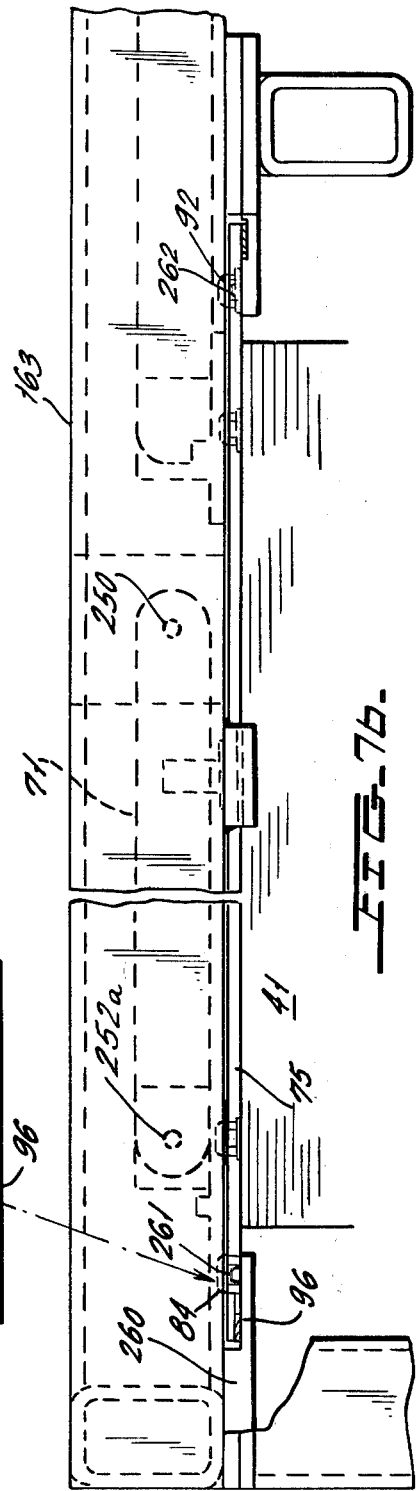

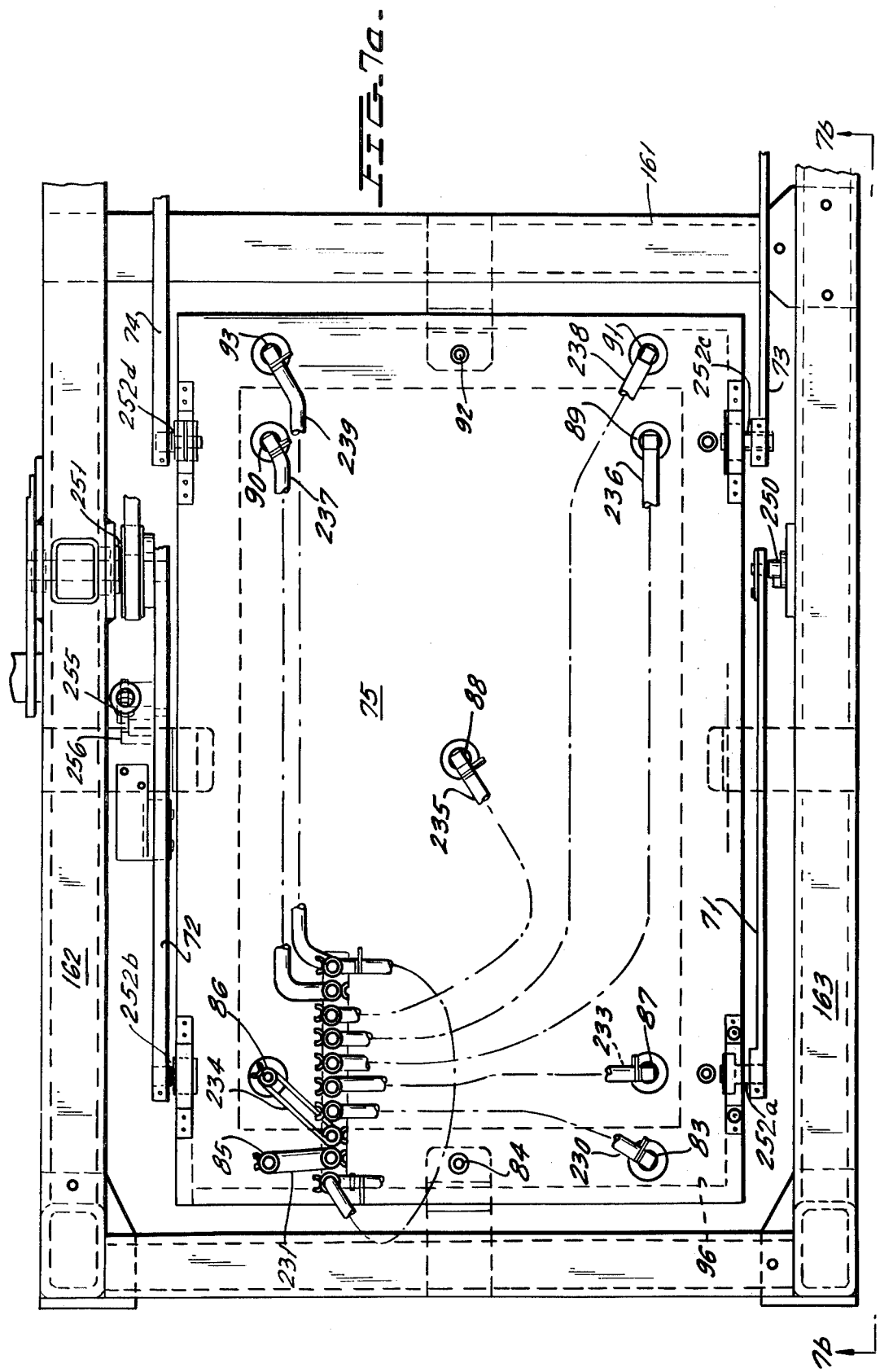

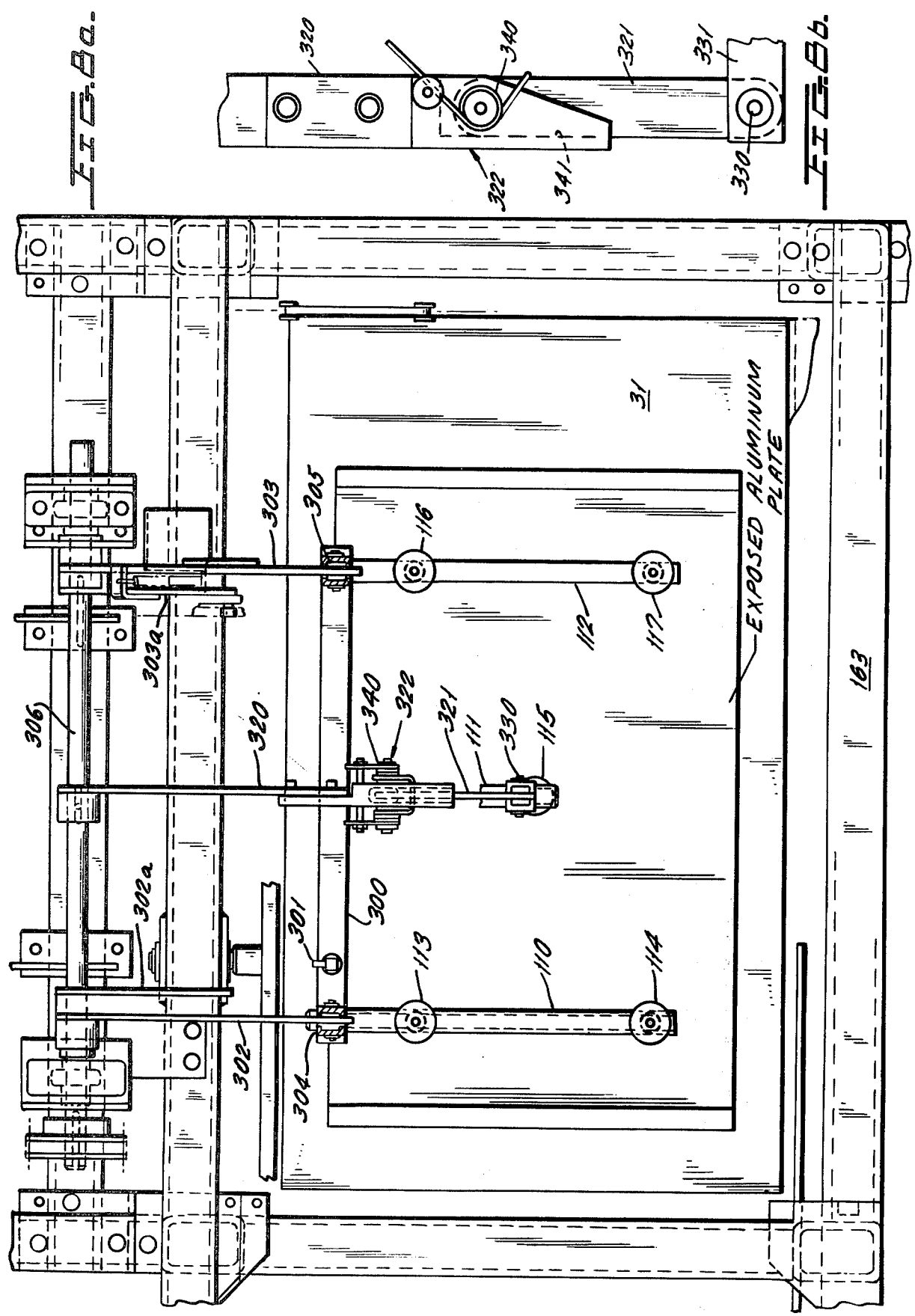

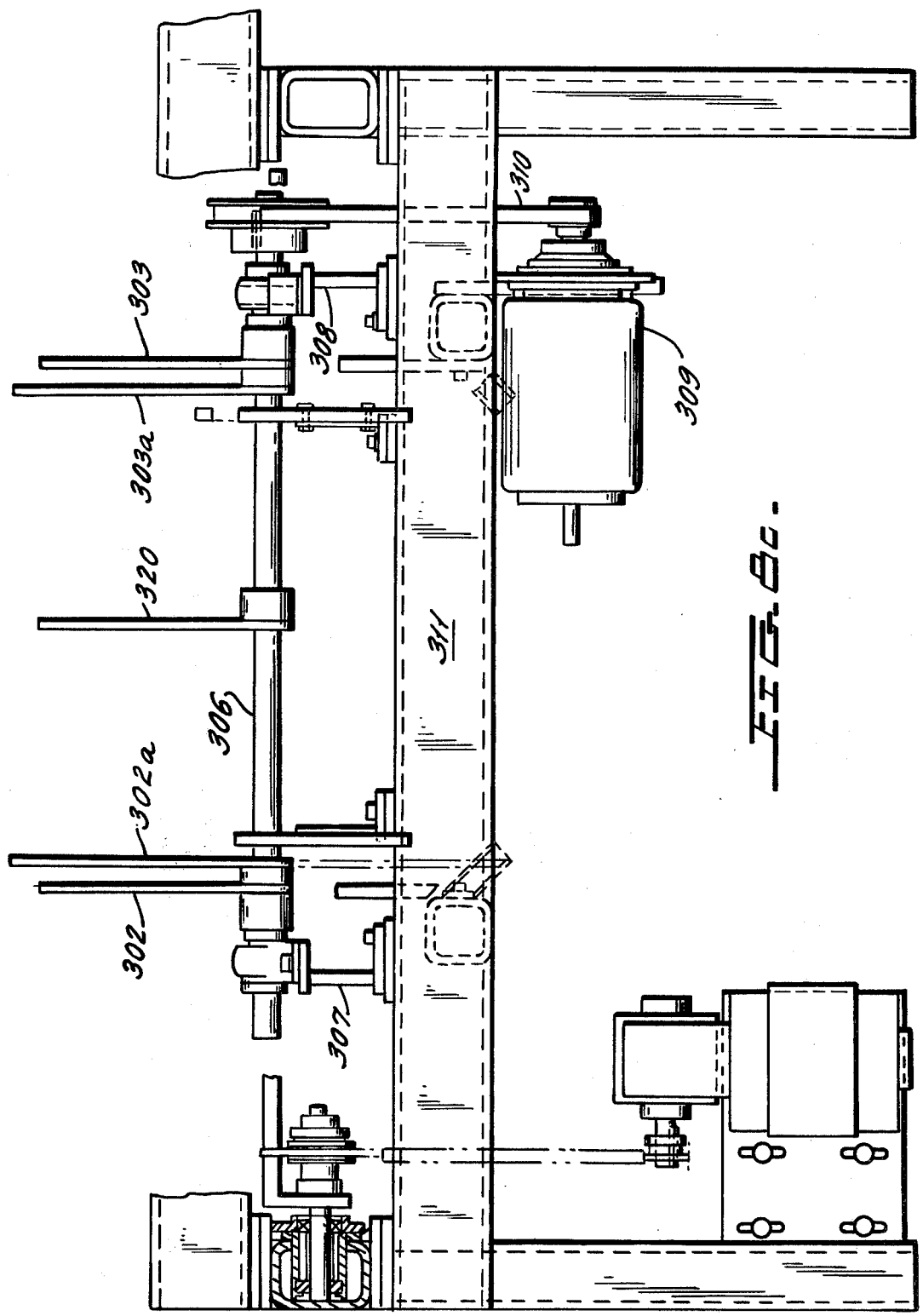

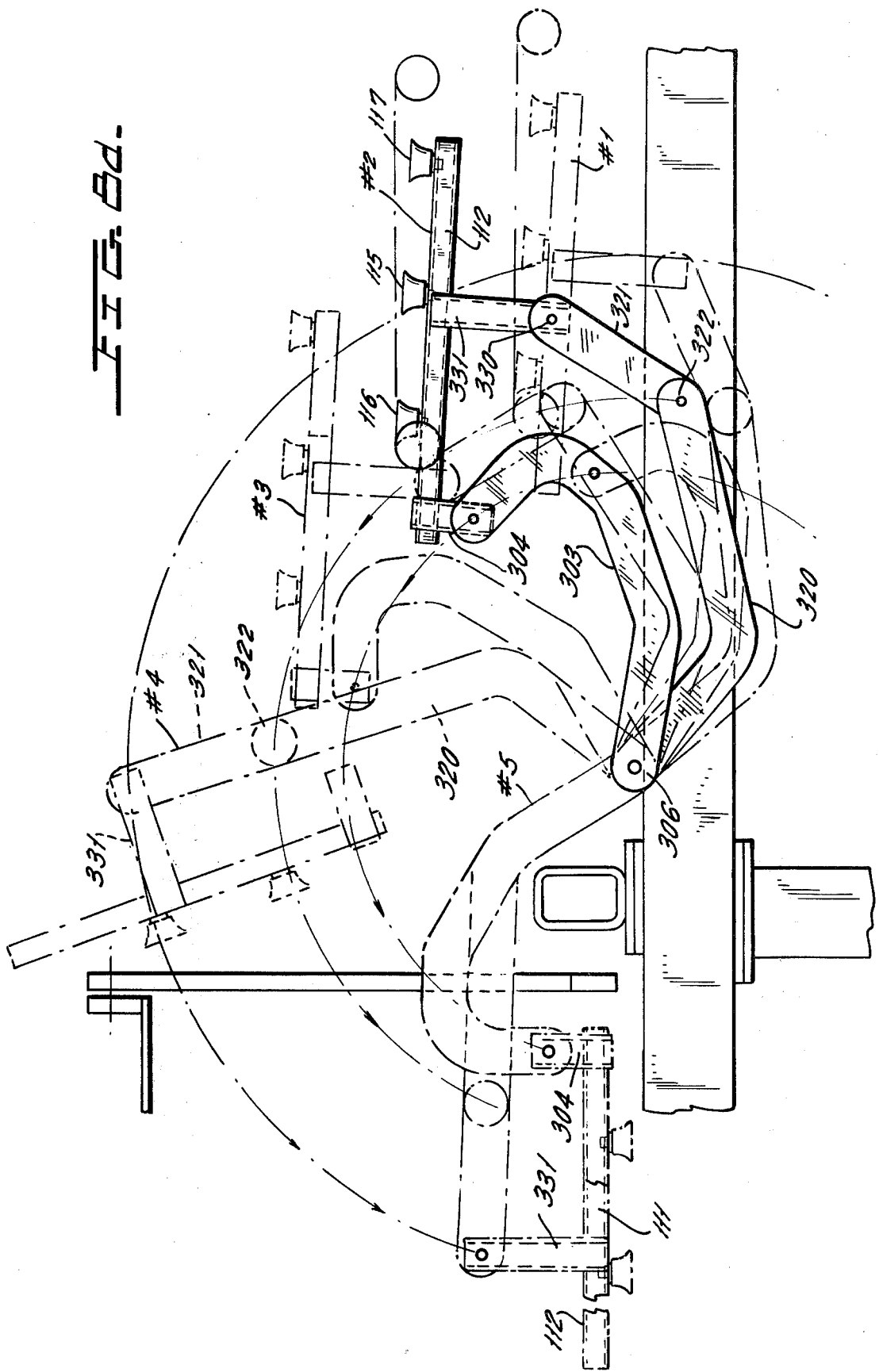

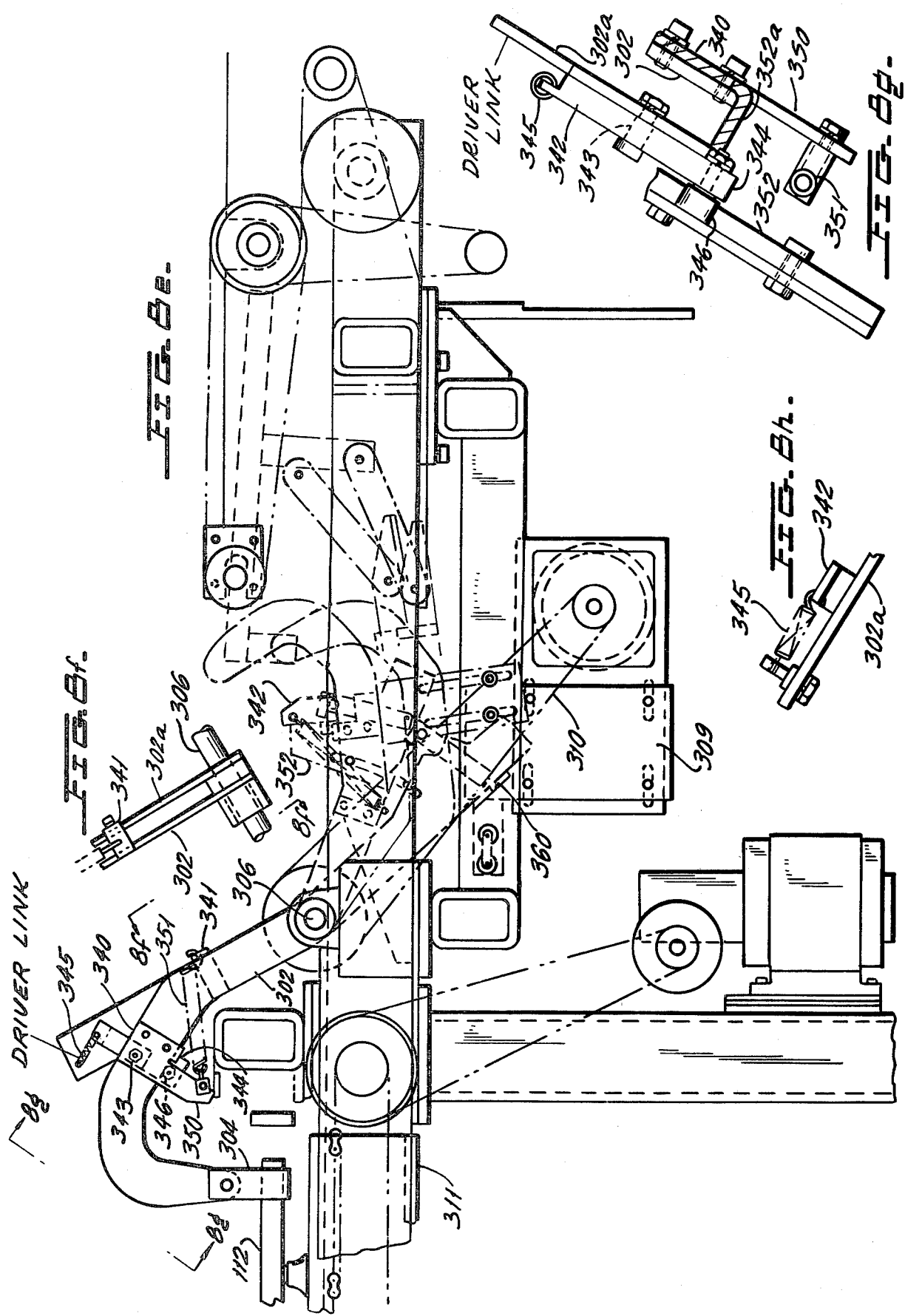

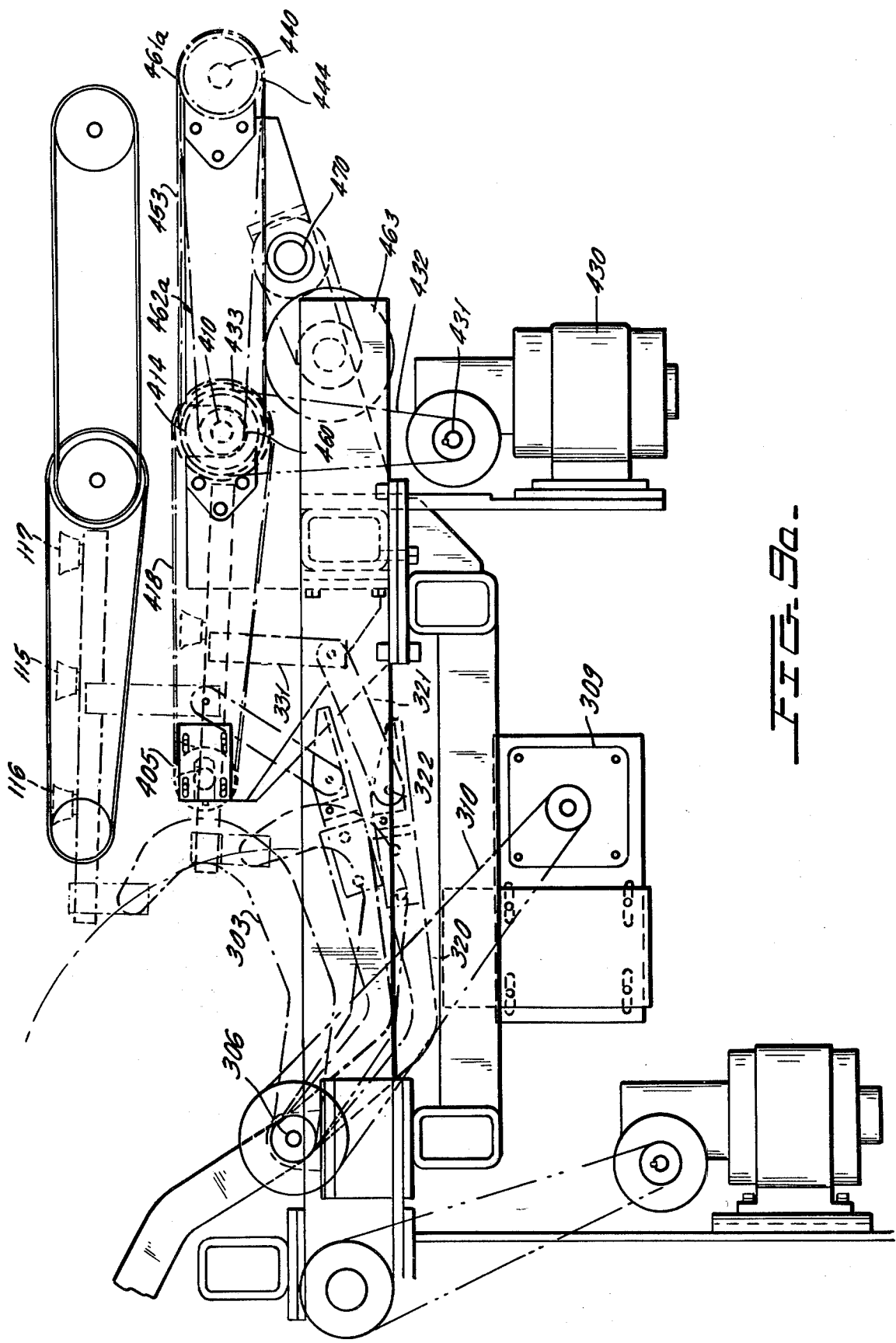

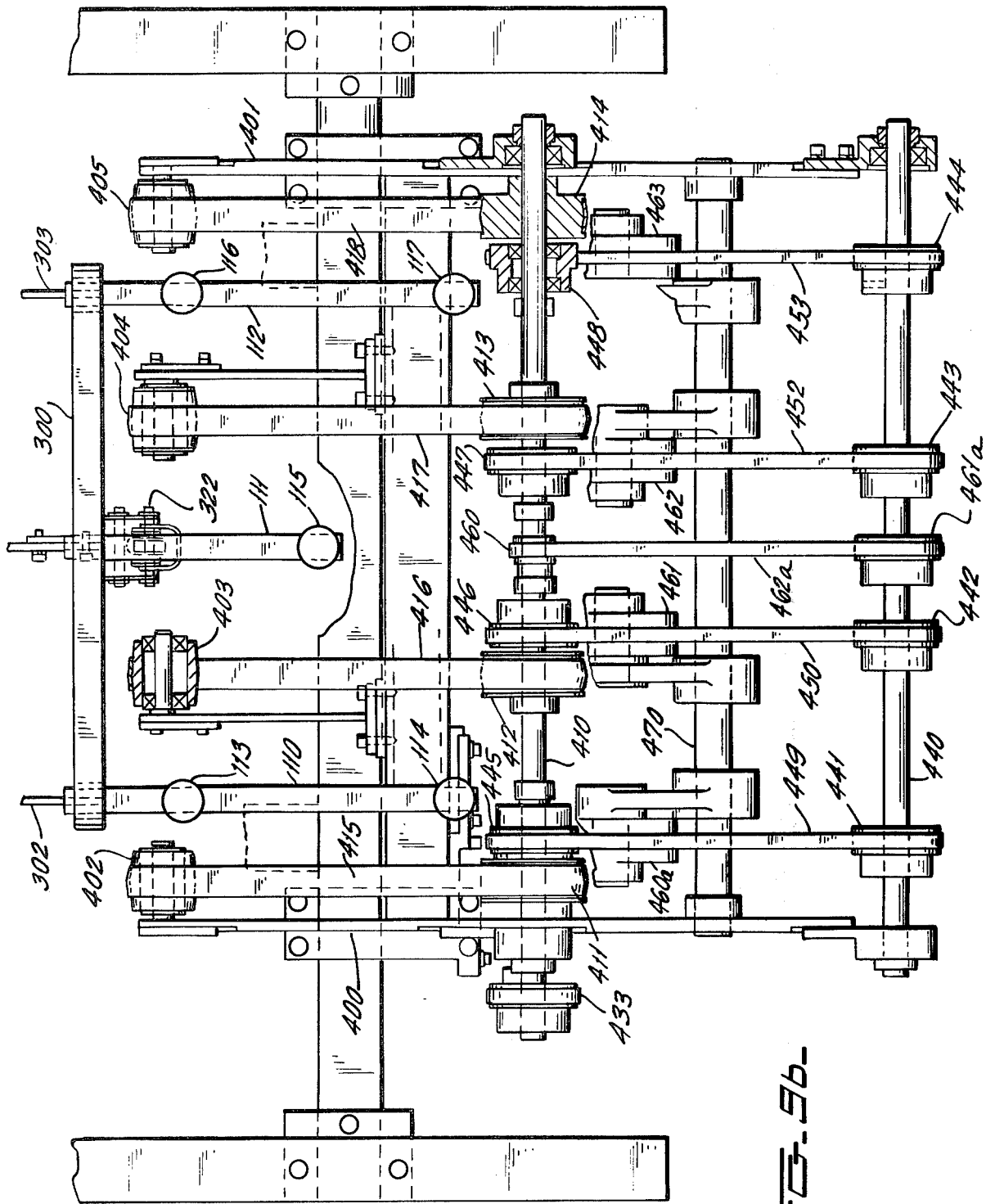

4,141,457

TRANSFER ARM ASSEMBLY FOR PLATE MAKING SYSTEM

RELATED APPLICATIONS

This application is related to copending application Ser. No. 802,980, filed June 2, 1977 in the name of Brigham, entitled PLATE MAKING SYSTEM, now U.S. Pat. No. 4,082,455.

BACKGROUND OF THE INVENTION

This invention relates to automatic plate making equipment, and more specifically relates to a novel high speed plate making system for producing a plurality of plates which can be used in a printing process, such as a newspaper printing process, from a single negative.

Daily newspapers are now converting to a printing process using a thin aluminum plate with a so-called "wipe on" coating or pre-sensitized coating in place of a letter press type arrangement. Most newspapers will run a large number of plates of the same page, thus requiring that a large number of plates be made from the same negative. The production of a large number of plates which are all appropriately aligned with a given negative has been a time-consuming process.

Numerous devices are known to make a plurality of plates from a single negative. Devices of this type are shown in U.S. Pat. Nos. 3,635,559, 3,810,694 and 3,922,087.

The present invention provides a novel automated process for making a large number of exactly aligned plates from a common negative at high speed while handling the plate on its non-image or back surface.

BRIEF DESCRIPTION OF THE PRESENT INVENTION

The present invention provides a novel apparatus which contains a plurality of coordinated sections for the manufacture of any desired number of wipe-on or pre-sensitized type plates from a single negative.

The first major component of the system is the negative support drawer assembly and negative exposure unit. The negative or film support drawer assembly consists of a sliding frame having locating pins for locating a negative in an exact position on the frame and the vacuum system to insure that the negative will be snugly held onto the table. A high intensity exposure lamp unit, which contains an ultraviolet lamp or lamps, is disposed beneath the sliding negative drawer and is in position to illuminate the negative and any photosensitive plate above the negative at an automatically controlled time and after a photosensitized plate has been placed atop the negative. The negative support drawer is slidable to an outer position to where a negative can be secured to the drawer and the drawer can then slide into an accurately located position in the apparatus relative to the exposure lamp. The operator may select a suitable automatic exposure time for the exposure system, for example, 3 seconds, and the film change can be made in about 13 seconds.

The next major component of the system is a plate supply arrangement wherein a stack of aluminum plates with photosensitive emulsions on one surface, or other suitable exposable plates are provided, with their photosensitive side facing downwardly so that the plates can be individually gripped on their upper and unsensitized surface without damaging the emulsion.

The plate stack may be carried on a cart which can be loaded into an adjustable height plate feeding system which may be controlled so that the top of the uppermost plate is accurately controlled in height and may be jogged against three adjustment stops for accurate preregistered positioning. The uppermost plate of the plate stack can be sensed by a suitable photosensing device which is accurate to less than the thickness of the relatively thin plate. The upper surface of the plate is then gripped by a parallelogram supported plate to move the plate from its accurately preregistered position into accurate registry with the film negative.

The equipment which moves the uppermost plate from the plate stack to the negative is the next major subcomponent of the system. It consists of a vacuum plate carried by a parallelogram arrangement wherein the vacuum plate engages the top of the stack of plates, picks up the uppermost plate of the stack, and holds the uppermost plate in an exactly aligned position relative to the system frame by virtue of the exact alignment of the uppermost plate of the stack. The parallelogram mechanism then moves the vacuum plate and the photosensitized plate to a location immediately above the top of the film negative on the film negative table. Guide openings in the vacuum plate mating with pins on the negative frame insure the accurate location of the photosensitive plate on the film negative, with its photosensitive side facing down. A vacuum is actuated in order to hold the aluminum plate surface firmly against the negative surface and to hold the vacuum plate on the film drawer support surface, and an exposure is made by the energization of high intensity lamps beneath the negative.

The parallelogram plate carrier is then moved away and toward the plate stack and toward a position where it can pick up the next plate of the stack.

A further major subassembly of the system then comes into operation which is a transfer arm mechanism which engages the top of the exposed plate with spaced vacuum cups, and then moves the exposed plate and inverts it onto a set of power driven delivery belts which feed the exposed plate, with its exposed side up, into a conventional plate processor. Once the transfer arm mechanism has removed the plate from the negative drawer, a new cycle begins and a second plate is delivered, by the parallelogram mechanism, to the negative table for a new exposure.

In the particular embodiment of the invention to be described herein, there is an approximately 20 second operating cycle for processing a single plate and about 3 plates per minute can be exposed and delivered to the plate processing unit in an automated manner and without operator attention. Up to 500 plates can be loaded into the machine and additional plates can be loaded without causing any substantial down-time of the unit. Moreover, the unit is compact and self-contained and can be operated by personnel with relatively little training.

Important features of the apparatus of the present invention are that, during the entire operating cycle, the plate is handled from its non-emulsion side and the plate is kept under positive control until it is fed into the photoprocessor apparatus. Suitable controls for operating the equipment may be adjusted to produce a given number of copies, whereupon the negative carrier, or the film frame, is automatically moved out to a loading position. The vacuum holding the film on the frame is released, and the operator can remove the film from its register pins and attach a new negative to the drawer. The frame is then returned to its exposure position with the new negative in place.

The claimed invention of this application deals with a novel double pivot arrangement for the transfer arm assembly which enables the assembly to rotate a plate from a first horizontal plane on the film negative drawer to a higher horizontal plane on the transfer belts.

BRIEF DESCRIPTION OF THE DRAWINGS

FIG. 1a is a perspective diagram of the assembled apparatus of the present invention with a covering shroud in place.

FIG. 1 schematically illustrates a plan view of the apparatus of the present invention with the covering shroud removed.

FIG. 2 is an elevation view of the front of FIG. 1.

FIG. 3 is an elevation view of the right-hand end of FIG. 1.

FIG. 4 is a cross-sectional view illustrating an aluminum plate in position within the film drawer for making an exposure.

FIG. 5b is an elevation view of the left-hand end of FIG. 5a.

FIG. 5c is an elevation view of the front of FIG. 5a.

FIG. 6a is a plan view of the film negative drawer of the specific embodiment of the present invention.

FIG. 6b is a partial cross-section and partial elevation view of the front of the film drawer of FIG. 6a.

FIG. 7a is a plan view of the film carrying plate and parallelogram mechanism of the specific embodiment of the present invention.

FIG. 7b is an elevation view and partial cross-sectional view of the front of FIG. 7a.

FIG. 8a is a plan view of the transfer arm assembly of the specific embodiment of the present invention with the transfer arm in position for picking up a plate from the film drawer.

FIG. 8b is a side view of the pivotal latch mechanism for one of the arms of FIG. 8a.

FIG. 8c is an elevation view of the rear of the assembly of FIG. 8a.

FIG. 8d is a diagram showing the operating linkage for the transfer arms in various positions of its operation cycle.

FIG. 8e is an elevation view of the transfer arm assembly and illustrates the novel latching action of the transfer arm assembly.

FIG. 8f is a partial view of FIG. 8e taken across the section lines 8f—8f in FIG. 8e.

FIG. 8g is a view of FIG. 8e taken across the section lines 8g—8g in FIG. 8e.

FIG. 8h is a view of FIG. 8e taken across the section lines 8h—8h in FIG. 8e, and particularly illustrates the spring connection between the latch member and one of the separable transfer arm links.

FIG. 9a is an elevation view of the side of the delivery belt system of a specific embodiment of the apparatus of the present invention.

FIG. 9b is a plan view of the delivery belt arrangement of the present invention.

DETAILED DESCRIPTION OF THE DRAWINGS

Figure 5A:
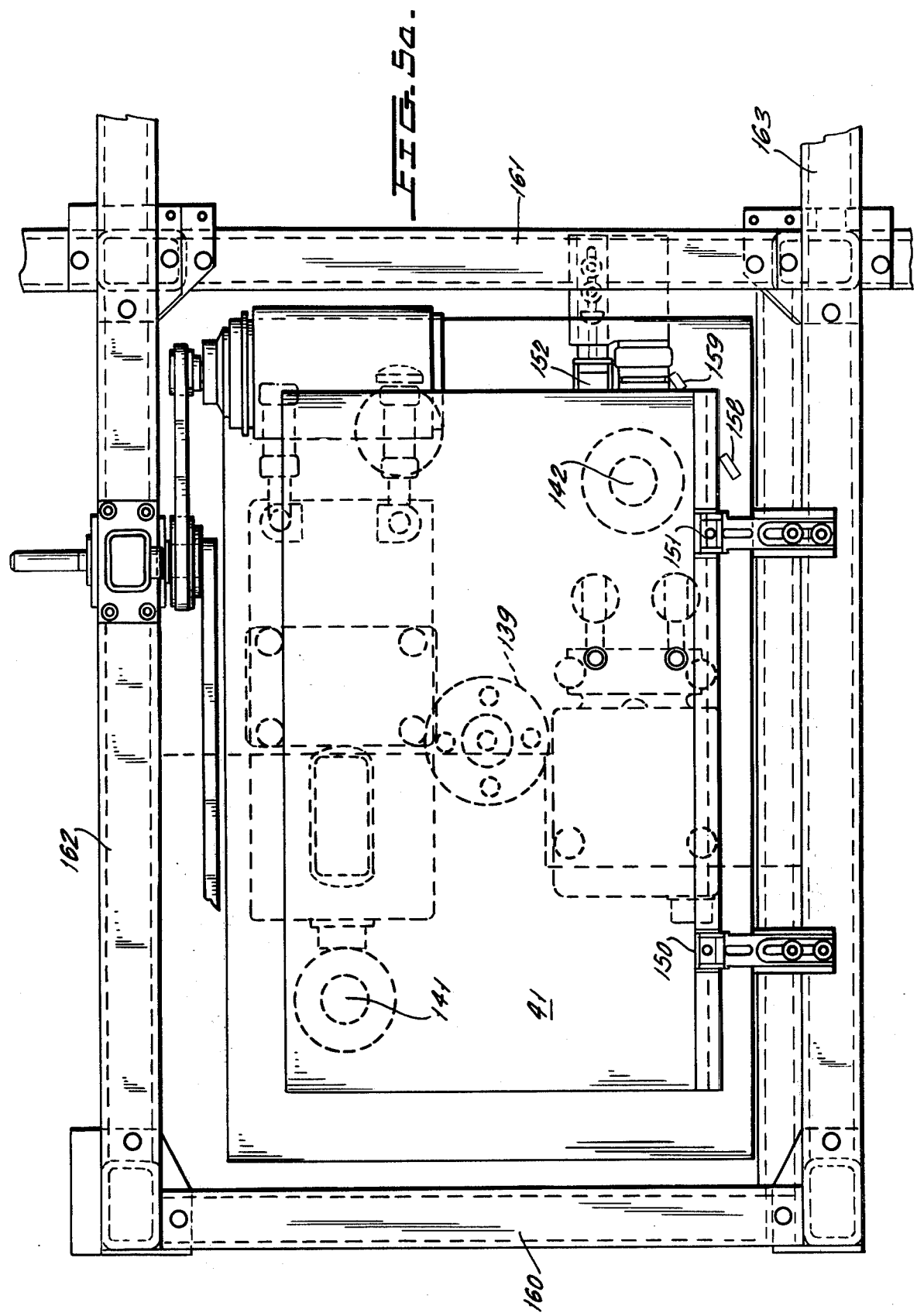
FIG. 5a is a plan view of the plate supply subassembly of a specific embodiment of the present invention.

Referring first to FIG. 1a, the novel plate making system of the invention is illustrated in perspective view with its housing in place. FIG. 1a illustrates the film drawer 31 moved outwardly to the position where an operator can load a film negative on top of the glass plate 32 and over positioning pins 190 and 191. The film drawer 31 in FIG. 1a is about waist high or 30 inches above floor level, and may be placed between work material support tables, such as tables 40. A suitable control panel 41a may also be provided as illustrated and will contain controls for setting copy numbers, and for programming the machine operation, and will also contain manual over-ride controls and operation indicators. The left-hand side of FIG. 1a has a stack of aluminum plates 41, which are loaded with their emulsion surface facing downwardly. Stack 41 is carried on a suitable carrier 42 which can move the stack 41 into the apparatus over roller conveyor 43.

Plates which have been automatically exposed in accordance with the present invention are delivered with the emulsion side facing upwardly on the delivery belts such as belts 449, 450, 451, 452 and 453 disposed at the rear of the equipment. A suitable plate processor, which may be of any standard commercially available type, and which is adapted to receive exposed aluminum plates with their emulsion side facing upwardly, then receives the output plate from the belts 449 to 453.

FIGS. 1, 2 and 3 illustrate the equipment of FIG. 1a in schematic fashion and with the housing shroud removed. Numerals which identify components in FIG. 1a identify similar components in FIGS. 1, 2 and 3.

FIG. 2 illustrates th stack of plates 41 which might contain as many as 500 plates, where the stack 41 and its tray 42 are schematically illustrated as being movable upwardly or downwardly under the influence of a motor, and are guided in brarings 50 and 51. The control motor is operated in order to place the topmost aluminum plate at a given vertical position which is determined by a suitable stack height monitor structure 52, which can be a photoelectric cell system or the like, to insure that the plate moving equipment will register properly with the topmost aluminum plate. In addition, a suitable pick-up and jogger assembly will be provided to separate the uppermost plate from the stack and to force at least the uppermost plate of the stack 41 against three spaced stops to insure that the plate has an exactly fixed position relative to the support frame. Thus, when the uppermost plate is picked up and moved to the film negative, it will be also accurately located relative to the film negative.

The film drawer 31 of FIG. 1a is also seen in FIGS. 1, 2 and 3 in the retracted position for loading a negative on the drawer. The film drawer 31 is mounted on rails, which will be later described in more detail, to enable the film drawer 31 to move upwardly in FIG. 1 and to the right in FIG. 3 to place the film drawer immediately above an exposure lamp system 60. Exposure lamp system 60 may also be mounted on rails to enable access to the lamps, the reflector, and the lamp cooling system.

When the film drawer 31 is in its outward position shown, the operator places a film negative on top of the glass plate 32, with the negative being aligned relative to the drawer 31 by having preformed openings fitted over the positioning pins 190 and 191.

A vacuum system (not shown in FIGS. 1 to 3) is also provided to exhaust all of the air between the negative and the glass plate 32, to insure that the negative will be snugly held in top of the film drawer 31. An operator with relatively little training will be able to remove the previous negative and install a new negative and then close the drawer in about 13 seconds. The drawer 31 may be moved between its open and closed positions by suitable automatic operating controls which can be operated or pre-set from the control panel 41a in FIG. 1.

Accurate positioning of the film drawer 31, when closed, is insured by a suitable tray stop 70 which may have a permanent magnet fixed thereto which seals against drawer 31 when it is closed. In addition, a V-block arrangement, which is located by a hardened pin arrangement, may also be used. Once the film drawer 31 is closed against stop 70 in FIG. 1 and is disposed above the lamp system 60, one of the aluminum plates from the top of stack 41 is to be deposited with its photosensitive surface facing downwardly on top of the negative, on top of glass plate 32, and accurately located relative to the negative on glass plate 32.

Lamp system 60 consists of a suitable elongated lamp 61 contained within a suitable reflector 62 and is operable to direct intense light upwardly toward the film drawer 31 to expose the photosensitive surface of an aluminum plate atop the film negative on the glass plate 32 of film carrier 31.

In order to move the topmost plates from stack 41 onto the negative on the closed film drawer 31, a novel parallelogram mechanism is provided which contains parallel identical arms 71 to 74. Arms 71 to 74 have their lower ends pivotally mounted on the support frame of the apparatus and have their upper ends pivotally mounted to the corners of a plate carrier 75. A suitable drive motor 76 is connected to the parallelogram linkage in order to operate the linkage through a suitable control circuit. In addition, suitable counterbalance springs can be mounted on stationary posts, and can be connected to the parallel link arms 71 to 74 in order to at least partly support the weight of the plate 75 during its operation, thus relieving the load somewhat from the operating motor 76. Alternatively, a moving carriage and cable reel spring arrangement could be used.

A typical counterbalance spring 77 is shown in FIG. 2 connected to schematically illustrated post 78 which is fixed to the main support frame. The plate 75 as shown in FIG. 2 is provided with vacuum line connections which are flexible, shown as flexible vacuum lines 80, 81 and 82, which are connected to small outlet openings in the bottom of plate 75. These hose nipple connections are schematically shown in FIG. 1 for vacuum openings 83, 85, 86 to 91, and 93. Openings 84 and 94 in plate 75 are openings which receive alignment pins 100 and 101 on drawer 31, as will be later described.

The parallelogram linkage will now operate such that the plate 75 moves from a position directly on top of the stack 41 to a position directly on top of the film drawer 31 for transporting plates from the top of stack 41 to the film drawer without inverting the plates. Thus, the plate 75 moves with parallel motion, to engage the top of stack 41. When the plate 75 rests on stack 41, vacuum is applied to vacuum openings 86, 87, 88, 89 and 90 so that the uppermost plate of stack 41 will adhere to the bottom of plate 75. The uppermost plate of stack 41 and plate 75 then move together when the parallelogram linkage is operated to rotate in a clockwise direction in FIG. 2. Note that the uppermost plate of stack 41 has been extremely accurately located relative to the machine frame so that it will also be accurately located on the plate 75.

The plate 75 and the aluminum plate secured thereto is then deposited immediately atop the glass plate 32 and in registry with the film negative which is secured thereto. This position is shown in FIG. 4, which schematically illustrates the plate 75 as it comes downwardly atop the film drawer 31. Note in FIG. 4 that the film drawer 31 is carried on a fixed drawer track arrangement and that the film drawer 31 is held against the stops, such as stops 70, shown in FIG. 1. The film negative is shown in FIG. 4 as located on pins 190 and 191 and the uppermost aluminum plate 95 of the stack 41 is shown as adhering to the bottom surface of carrier 75 by virtue of vacuum which has been applied to the openings 86 to 90 in plate 75. The plate 95 is extremely accurately located relative to the film negative on top of plate 32 by virtue of extreme accuracy in positioning plate 95 on the top of the stack before it is picked up by the plate 75.

The bottom surface of plate 75, as is best shown in FIG. 4, is provided with a gasket 96 which seats around and is outside of the periphery of the film negative and seals against the upper surface of the film drawer 31. As the plate 75 comes down on top of the film drawer 31, it and thus plate 95 are accurately located relative to the film drawer by virtue of locating pins 100 and 101 on the film drawer which enter openings 84 and 92, respectively, in the plate 75. After the plate 95 is seated against the negative, vacuum is applied to openings 83, 85, 91 and 93 in plate 75 to eliminate any possible air film between the aluminum plate 95 and the film negative.

The exposure lamp system 60 is then operated to produce an intense light which passes through the glass 32 and the film negative to expose the downwardly facing emulsion on the plate 95. The exposure lasts about 3 seconds and, when complete, positive pressure is applied to the hoses connected to openings 83, 85 to 91, and 93. This removes plate 95 from the parallelogram transport plate 75 so that, when the transport plate 75 is moved, the exposed plate 95 will remain on top of the film negative.

The parallelogram linkage then operates to return plate 75 to the position shown in FIG. 2, in order to pick up the next uppermost plate of stack 41. Note that stack 41 has been operated through its operating motor, guided by bearings 50 and 51 so that the next uppermost plate is moved upwardly until stopped by the stack height monitor 52. In an actual embodiment of the invention, a single motor, operating through a jack, is used and the stack is guided for motion by suitable guide rods.

It is now necessary to move the exposed plate 95 of FIG. 4 from the film drawer 31. This operation is performed by a novel transfer system which grips the plate through vacuum means, on its upper surface and then inverts the plate to move it to a suitable delivery belt which will deliver the plate, emulsion side up, into a suitable photoprocessor.

The vacuum transfer system is schematically illustrated in FIGS. 1, 2 and 3 and consists of a transfer vacuum frame having arms 110, 111 and 112. Arm 110 has vacuum cups 113 and 114. Arm 111 has a vacuum cup 115, and arm 112 has vacuum cups 116 and 117. A suitable vacuum supply is connected to cups 113 to 117 through tubes in arms 110, 111 and 112. All of the vacuum cups 113 to 117 are fixed in a common plane and move, as a single body, with the rotation of pivotal support arms 120, 121 and 122.

Support arms 120, 121 and 122 are mounted on a common pivotal support 306, as best seen in FIG. 3. The entire transfer vacuum assembly is then rotatable about the pivot 306, such that the vacuum cups 113 to 117 can rotate from a retracted position, in which the cups face upwardly and are disposed in a generally horizontal plane, to an operating position in which they are rotated counterclockwise about the pivot 306 to face downwardly and engage the upper back surface of plates, such as plate 95, lying atop the film drawer 31. Note that, when the vacuum cups 113 to 117 are rotated to pick up an exposed aluminum plate, they engage the exposed aluminum plate on its upper unsensitized surface.

Once the parallelogram linkage has moved plate 75 out of position, a suitable operating control operates motor 124 shown in FIG. 3 to move the vacuum transfer arms counterclockwise such that the members 113 to 117 will engage the rear surface of the plate on the drawer 31. A vacuum is then drawn in cups 113 to 117 to cause the cups 113 to 117 to adhere to the rear surface of the plate. Thereafter, the motor 124 is energized to cause the entire frame to rotate clockwise about the pivot 306 in FIG. 3, to move the plate out of the flm drawer and also to invert the plate so that its photoemulsive side faces upwardly. As the transfer frame continues to rotate clockwise in FIG. 3, the arms 110, 111 and 112 pass through and between delivery belts. The vacuum holding the plate to the frame is released as the belts are reached, and the plate is deposited on top of the belt for delivery to a suitable processor.

The delivery belt system is shown in FIGS. 1 and 3 as consisting of two sets of belts which operate at different speeds. Thus, there is a first set of belts 415 to 418, which are each continuous belts rotating in a direction such that their top surface moves away from the film drawer 31 and toward a photoprocessor discharge region. These belts 415 to 418 move essentially in the same plane as the second set of belts 449 to 453 which were previously described in connection with FIG. 1a. Belts 415 to 418 move at a relatively high speed in order to move plates away from the region of the transfer arms as quickly as possible to enable the early recycling of the apparatus. Belts 449 to 453 move at a lower speed, and at a speed determined by the photoprocessor. Note that, once the plate has been moved on top of the belts which deliver the plate to the photoprocessor, the parallelogram linkage can move member 75 to deposit a new plate on drawer 31.

FIGS. 1a and 1 to 4 schematically illustrate the device of the invention. The following figures illustrate a specific preferred embodiment of the invention where numerals identifying similar components to those of FIGS. 1 to 4 identify similar components in FIGS. 5 to 9.

PLATE SUPPLY ARRANGEMENT

Referring first to FIGS. 5a, 5b and 5c, there is shown a specific arrangement which can be used for the plate supply for supporting plate stack 41. FIGS. 5a and 5c show support tray 42 which can be raised and lowered by a suitable worm-drive motor 139 which drives shaft 140 connected to tray 42. Support tray 42 carries a plurality of parallel rollers 43 to assist in the loading of a stack 41. The stack of plates 41 is shown as disposed atop rollers 43. Suitable stabilizer shafts 141 and 142, which are slidable in suitable bearings, prevent the tray 42 from tilting as it moves up and down.

Three adjustable stops are provided adjacent to stack 41 including the adjustable side-stop position members 150, 151 and 152 which enable the accurate positioning of the uppermost plate of stack 41 relative to the support apparatus. Stops 150, 151 and 152 are resiliently biased above the level of the uppermost plate of stack 41.

A jogging means is provided for jogging the stack 41 against the stops 150, 151 and 52. The jogging mechanism is shown schematically in FIGS. 1 and 2 and comprises a vacuum cup 154a mounted on a sliding arm 155 which is rotatably mounted to the frame 162 by pivotal arm 156. A suitable vacuum connection (not shown) is connected to cup 154a. A vibrating solenoid (not shown) may also be connected to the cup to help separate the upper sheet from the stack 41. The jogging mechanism operates after the stack 41 has moved to its desired height, and arm 156 moves from the dotted-line position in FIG. 1 to its solid-line position, and the arm 155 then moves down so the cup 154a engages the upper plate of the stack. A vacuum is drawn in cup 154a and the arm 154 is slightly raised to raise the corner of the uppermost plate, and the arm 156 is rotated counterclockwise in FIG. 1 to move the uppermost plate slightly off the stack 41 and into engagement with the three-positioning stops 150, 151 and 152 (FIG. 5a). The cup 154a then releases the uppermost plate and retracts to its dotted-line position in FIG. 1.

FIGS. 5a and 5c further illustrate the placement of a photosensing mechanism which is operable to sense the position of the top of stack 41 and to deliver an output signal to the control mechanism so that the operating motors which raise the stack ar appropriately controlled. Thus, a lamp 158 and photosensor 159 are mounted adjacent a corner of stack 41, and monitor the presence or absence of an uppermost sheet of the stack 41 at their level. The output of photosensor 159 then controls motor 139 through an an appropriate control circuit. Note that lamp 158 and photosensor 159 can be mounted in any other desired manner.

All of the components described above in connection with FIGS. 5a, 5b and 5c are supported from a common support frame consisting of welded or bolted tubular members which are made of a suitable structural steel.

FILM NEGATIVE CARRIAGE ASSEMBLY

FIGS. 6a and 6b illustrate the novel negative carriage or film drawer assembly 31. Referring to FIGS. 6a and 6b, the top of the assembly is held about 30 inches from the floor by tubular frame members 160, 161, 162 and 163. Tube 161 has a U-shaped rail 170 clamped thereto while the support member 160 has spaced rod support members, such as member 171, extending therefrom which support a guide rod 173 between them. The film drawer body 31 is then provided with a rotatable wheel 175 which rides on the track 170 and is also provided with shaft-receiving members 176 and 177 which are slidably mounted on shaft 173. Thus, the drawer assembly 31 is slidably mounted on the main support frame so that it can be moved from the position shown in FIG. 1a, where it is exposed for use by an operator, to the closed position where an exposure can be made of an aluminum plate carried on the drawer assembly.

FIG. 6a further illustrates the glass table 32 supported within a suitable glass mount opening 180 which may be about 1/32 of an inch greater in dimension than that of the glass.

FIGS. 6a and 6b further illustrate film locating pins 190 and 191 and also pins 100 and 101 for locating the plate 75 on top of the film drawer when the plate 75 moves into position as was described in connection with FIG. 4.

FIG. 6a illustrates, in dot-dashed lines, the boundary of the film negative, and the boundary of the plate which is to be exposed from the film negative.

As is further shown in FIGS. 6a and 6b, plate 31 is provided with a vacuum channel for enabling the evacuation of air between the film negative and the glass 32 when the negative is placed in position. This vacuum channel is illustrated as the channel 200 which is a rectangular channel underlying the film negative and disposed between the glass and the carrier 31. Any suitable vacuum connection can be made to this channel. A plurality of conventional glass plate clamps 201 clamp the glass 32 against a gasket (not shown) to form the vacuum channel.

The drawer 31 of FIGS. 6a and 6b has a magnetic plate 210 connected thereto which is movable relative to a permanent magnet 211 which is fixed to support channel 162. FIG. 6a shows the magnet 211 sealed against plate 210, thereby to hold the drawer 32 in a fixed position relative to the support frame. Note that a V-shaped locating slot which can receive a pin on drawer 32 and a suitable ring stop (schematically shown in FIG. 1) can also be used to accurately locate drawer 32 in its closed position. A micro-switch 215 is also fixed to the support frame 162 and the switch 215 is operated when the plate 75 reaches the film drawer in order to actuate suitable controls needed to lock the aluminum plate into position on the film drawer 31.

PARALLELOGRAM TRANSFER ASSEMBLY

FIGS. 7a and 7b illustrate the novel plate 75 and its parallelogram support, with the plate 75 being disposed atop stack 41 (FIG. 5a). FIG. 7a shows openings 83, 85, 86, 87, 89, 90, 91 and 93 which are connected to flexible vacuum hoses 230 and 239, respectively.

FIG. 7a further shows the pivotal connection of arms 71 and 72 to the support frame members 163 and 162, respectively, at the pivots 250 and 251, respectively. Similar pivotal supports are provided for the parallelogram links 73 and 74 which have a length identical to that of lengths 71 and 72. Arms 71 and 72 are pivotally connected to plate 75 at pivots 252a and 252b, respectively. Similarly, arms 73 and 74 are connected to plate 75 at pivots 252c and 252d, respectively. Any desired counterbalance can be used to balance the weight of plate 75. FIG. 7a shows one type of counterbalance which includes the counterbalance spring 255 which has one end thereof connected to a spring connection end 256 of arm 71. A similar counterbalance spring arrangement can be provided for each of the parallelogram links. Note that other counterbalance arrangements could be used.

Also illustrated in FIGS. 7a and 7b are the positioning openings 84 and 92 in plate 75 which register with pins 100 and 101 on drawer 31 in FIGS. 6a and 6b. In order to insure registration between the carrier 75 and the top aluminum plate of stack 41, when the plate is picked up, the surface 260 of the stack support assembly in FIG. 7b contains positioning pins 261 and 262 which receive openings 84 and 92. This insures that the plate 75 will settle in the precisely correct location on top of stack 41 before the uppermost plate of stack 41 is picked up with the application of vacuum to the conduits 233, 234, 235, 236 and 237.

After the plate 75 picks up the uppermost plate of stack 41, which has been exactly located within the stack, it moves to the film drawer 31 to deposit the plate atop the film drawer 31 as previously discussed. Once the plate 75 settles on top of the film drawer or platform 31 of FIGS. 6a and 6b, vacuum is applied to vacuum conduits 230, 231, 238 and 239 in order to remove any air which might be trapped between the film negative and the aluminum plate carried by plate carrier 75. After the aluminum plate has been exposed in the position of FIGS. 6a and 6b, positive pressure is applied to all of conduits 230 to 239 of FIG. 7a so that the carrier 75 can move away and leave the exposed aluminum plate behind on the film drawer 31. In order to insure that a good vacuum is drawn between the plate 75 and the film drawer surface 31 in FIG. 6a and, as is best shown in FIGS. 7a and 7b, a seal 96 (see FIG. 4) is formed around the bottom surface of plate 75 and this seal will seal against the upper surface of the film drawer 31.

TRANSFER ARM ASSEMBLY

FIGS. 8a and 8d show the various components which are used to form a novel transfer arm assembly of a type slightly different from that schematically illustrated in FIGS. 1, 2 and 3. In the preferred embodiment, the transfer arms pick up exposed plates, from the film drawer 31, and then deposit the exposed plates with their emulsion side facing upward, at a level higher than the drawer level, and then drop below the belts after depositing the plate on the belts.

Referring to FIG. 8a, the arms 110, 111 and 112 (see FIG. 1) are shown overlying the film drawer 31 and in position to pick up an exposed aluminum plate from the top of drawer 31. Each of arms 110, 111 and 112 contain the various vacuum cups 113 to 117 which are connected to a suitable vacuum supply through tubes in arms 110, 111 and 112. The cups 113 to 117 are coplanar and, when they contact the back surface of an exposed aluminum plate, they are coplanar with its surface and the film drawer 31.

Each of the arms 110, 111 and 112 is then rigidly connected to the cross-brace member 300 which has a hollow tube extending therethrough connected to a fitting 301 to allow the connection of a flexible vacuum conduit to the arms 110, 111 and 112 and their respective vaccum cups. Two identical circularly shaped arms 302 and 303 then have one of their ends pivotally connected to the member 300 at the pivots 304 and 305, respectively, as shown in FIG. 8a.

The shape of arm 303 is best shown in FIG. 8d where the arm 303 is shown in five positions labeled 1 through 5 showing the sequence of operation of the transfer system. Note that positions 1 and 2 also show different heights of the belts from floor level to accommodate different style photoprocessors.

Arms 302 and 303 are then rotatably mounted relative to and on shaft 306, which is rotatably supported in brackets 307 and 308 as shown in FIG. 8c. As will be later described, arms 302 and 303 are driven by driver arms 302a and 303a which are connected to shaft 306 and are rotated by shaft 306.

Brackets 307 and 308 are suitably supported by frame member 311 as best seen in FIG. 8c which is a rear view of th transfer arm assembly. The shaft 306 is rotatably driven by the motor 309 shown in FIG. 8c which is connected to shaft 306 by the belt 310. Motor 309 is then controlled in any suitable manner from a control circuit.

Rotatable shaft 306 also carries a central connection member 320 which rotates with members 302 and 303 and is shown in the five different positions labeled 1 to 5 in FIG. 8d, which correspond to the same labeled positions of member 303.

The outer end of arcuate link 320 is pivotally connected to a second link 321 as shown in FIGS. 8a, 8b and 8c, where the pivotal connection 322 is a yieldable pivot arranged such that links 320 and 321 can straighten out as they rotate from position number 1 to position number 4 but will remain in a straight line relative to one another as shown in positions 4 and 5.

The outer end of link 321 is then pivotally connected, by the pivot 330, to connecting rod 331 which is rigidly connected to the arm 111.

The pivot 322 is best shown in FIGS. 8a and 8b and includes a spring 340 which tends normally to hold links 320 and 321 in the straightened condition shown in FIG. 8b where the link 321 rests against interior shoulder 341.

A latchable connection is provided between driver arms 302a and 303a and their driver arcuate arms 302 and 303, respectively, as is best shown in FIGS. 8e and 8h for arms 302 and 302a. Each of arms 302 and 302a have angle plates 340 and 341, respectively, bolted thereto which serve to allow the arms 302 and 302a to engage one another and move together from the position number 5 in FIG. 8e to the position number 2 in FIG. 8e. Links 302a and 302 are latched together by the latch member 342 which is pivotally mounted on line 302 by pivot pins 343. Latch member 342 carries a latching projection 344 at one end and a spring 345 at its other end. A cam roller 346 is also carried at the one end of latch member 342. Spring 345 is fixed to link 302a and tends to rotate latch 342 counterclockwise in FIG. 8e.

Angle plates 340 on arm 302 has an upwardly extending portion 350 which receives one end of spring 351. The other end of spring 351 is connected to angle 341, thereby tending to hold arms 302 and 302a in the position shown and together. The latch projection 344 is latched over the latching surface 352a of angle 340, to latch the two arms together, and to insure that they rotate together until the latch is defeated.

A fixed cam 352 is attached to support 311 and is located such that, when arms 302 and 302a reach position number 2 (in solid lines for latch arm 342), the roller 346 is pressed to the right to move latch 344 out of latching relation to angle 340. Arm 302 then engages a stop (not shown) and stops in position number 1, but arm 302a continues to rotate (counterclockwise in FIG. 8e) until it hits a stop 360.

During the continued rotation of shaft 306, after arm 302 has stopped rotating, the frame 110, 111, 112 continues to rotate due to continued motion of arm 320. However, the continued rotation will now be around the axis of member 300 (since arms 302 and 303 are stationary) so that the arms 110, 111 and 112 can come to rest in a plane parallel to but above the plane they assume when they pick up a plate from the film negative drawer.

When the arms 302 and 302a now rotate away from their stop positions in FIG. 8e, the springs 345 and 351 will reset the latch between them and they will move together to position number 5 in FIG. 8e.

The operation of the novel transfer arm arrangement can also be understood from FIG. 8d which shows the arms 111 and 112 in various operating positions. In the initial retracted position number 1 of FIG. 8d, the arms 111 and 112 are retracted below the level of the plate receiving belts which will be later described. This level is vertically above the level of the plate which is to be removed from the plate drawer 31 which is position number 5 for the arms 111 and 112.

The novel transfer arm construction permits rotation of the arms 111 and 112 (as well as arm 110) from position number 1 to position number 5 and plate pick-up occurs when the cups 113 to 117 engage the back of the plate to be transferred. A vacuum is then applied to the various vacuum cups 113 to 117 and the transfer arms are then rotated from position 5 to the position number 1. During this rotation, the plate will be inverted so that it has been grasped on its non-emulsion side at position number 1 and, as the transfer arms rotate to position number 5, the plate is inverted with its emulsion up, and is deposited on the belts. Note that the vacuum on cups 113 to 117 is broken just before the belt position is reached. The arms 110 to 112 continue to rotate, and finally retract beneath the level of the belts. The latching arrangement described above permits the transfer arms to rotate from a first horizontal position to an inverted but higher horizontal position by causing the link 320 to break when the transfer arms move away from film negative drawer location 5.

DELIVERY BELT SYSTEM

The delivery belt or take-off system is best shown in FIGS. 9a and 9b in connection with the plate transfer assembly of FIGS. 8a through 8d. In FIGS. 9a and 9b, the take-off system is shown as being supported within side frame members 400 and 401 which rotatably receive roller conveyor belt support members 402 to 405.

The support frames 400 and 401 also pivotally receive a rotatable shaft 410 which carries roller drive members 411 to 414. Suitable endless flexible belts 415 to 418, respectively, are mounted between pulleys 402–411, 403–412, 404–413, and 405–414. A suitable drive motor 430 (FIG. 9a) drives a shaft 431 which has a drive belt 432 connected thereto which drives the pulley 433 mounted on the left-hand end of shaft 410 as shown in FIG. 9b, in order to rotatably drive the shaft 410.

A second shaft 440 is rotatably mounted between end plates 400 and 401 in FIG. 9b and contains a plurality of drive pulleys 441 to 444 which are connected to wheels 445 to 448, respectively, on the shaft 410 by the belts 449 to 453, respectively. A drive belt connection is then made from the pulley 460 on shaft 410 to the pulley 461a on shaft 440 by the drive belt 462a.

In operation, the upper surfaces of all of drive belts 415 to 418 and 449 to 453 are driven to the right in FIG. 9a, and downward in FIG. 9d, and toward th discharge end of the apparatus which contains a conventional photoprocessor which will receive plates from the belts with their emulsion side facing upwardly. As the transfer arms 110, 111 and 112 move downwardly between the belts 415 to 418 as shown in FIG. 9d, vacuum is released at the vacuum cups 113 to 117 and the plate carried by the transfer arms is deposited atop the belts 415 to 418. These belts then move the plate onto faster moving belts 449 to 453 which ultimately discharge plate 95 from the equipment.

Belts 449 to 453 will move at a speed determined by the rate at which plates are to be supplied to the plate processor. Belts 415 to 418, however, are higher speed belts to remove plates from interfering with the return motion of the transfer arm assembly.

It will be noted that the belts 449 to 453 travel over respective pulleys 460a, 461, 462 and 463. Pulleys 460a, 461, 462 and 463 are rotatably carried on support shaft 470 and are adjusted to press upwardly against belts 449 to 453 to apply suitable tension to the belts. Pulleys 460a, 461, 462 and 463 are the fixed in the desired adjustment position by any suitable locking mechanism.

Although a preferred embodiment of this invention has been described, many variations and modifications will now be apparent to those skilled in the art, and it is therefore preferred that the instant invention be limited not by the specific disclosure herein but only by the appended claims.

The embodiments of the invention in which an exclusive privilege or property is claimed are defined as follows:

1. A transfer arm assembly for a plate making device and for transferring an exposed plate on a horizontal film negative drawer to an inverted horizontal position on a belt transfer system which is at a height different from the height of said film negative drawer; said transfer arm assembly comprising vacuum cup carrier means having a plurality of spaced vacuum cups for engaging the non-exposed surface of said plate when said plate is on said drawer; first, second and third links each pivotally mounted on a common driven shaft; said first and second links being connected to said common shaft and being rotatable therewith; said third link being rotatable relative to said common shaft; latch means for latching said second and third links to force said third link to rotate with said second link when said latch means is engaged; first pivotal connections means for pivotally connecting said first link to said vacuum cup carrier means at a first location thereon, and second pivotal connection means for pivotally connecting said third link to said vacuum cup carrier means at a second location thereon; and latch defeating means for defeating said latch means before said vacuum cup carrier means reaches the level of said belt transfer system, whereby said vacuum cup carrier means can rotate on a reduced radius.

2. The transfer arm assembly of claim 1 wherein the axis of rotation of said vacuum cup carrier means on said first and second pivotal connection means is parallel to said common driven shaft.

3. The transfer arm assembly of claim 2 which further includes drive motor means for driving said driven shaft to move said vacuum cup carrier means between said film negative drawer and said belt transfer system.

4. The transfer arm assembly of claim 1 wherein said vacuum cup carrier means includes at least three vacuum cups disposed at the corners of a triangle.

5. The transfer arm assembly of claim 1 wherein said belt transfer system is higher than said film negative drawer.

6. The transfer arm assembly of claim 1 which further includes biasing means for biasing said latch means closed after said vacuum cup carrier means rotates towards said film negative drawer.

7. The transfer arm assembly of claim 1 wherein said belt transfer system includes a plurality of spaced, parallel belts, and wherein said transfer arm assembly includes at least two parallel spaced arms carrying vacuum cups and being respectively movable between and below spaced belts of said plurality of belts.

8. The transfer arm assembly of claim 3 wherein said belt transfer system is higher than said film negative drawer.

9. The transfer arm assembly of claim 8 which further includes biasing means for biasing said latch means closed after said vacuum cup carrier means rotates towards said film negative drawer.

10. The transfer arm assembly of claim 9 wherein said belt transfer system includes a plurality of spaced, parallel belts, and wherein said transfer arm assembly includes at least two parallel spaced arms carrying vacuum cups and being respectively movable between and below spaced belts of said plurality of belts.

* * * * *